US010936456B1

(12) United States Patent
Shur et al.

(10) Patent No.: US 10,936,456 B1
(45) Date of Patent: Mar. 2, 2021

(54) HANDLING MALFUNCTION IN A MEMORY SYSTEM COMPRISING A NONVOLATILE MEMORY BY MONITORING BAD-BLOCK PATTERNS

(71) Applicant: Apple Inc., Cupertino, CA (US)

(72) Inventors: Yael Shur, Tel Aviv (IL); Assaf Shappir, Ganey Tikva (IL); Stas Mouler, Kfar Saba (IL); Yoav Kasorla, Even Yehuda (IL)

(73) Assignee: APPLE INC., Cupertino, CA (US)

( * ) Notice: Subject to any disclaimer, the term of this patent is extended or adjusted under 35 U.S.C. 154(b) by 148 days.

(21) Appl. No.: 16/280,090

(22) Filed: Feb. 20, 2019

(51) Int. Cl.
*G06F 11/00* (2006.01)
*G06F 11/20* (2006.01)
*G06F 11/14* (2006.01)

(52) U.S. Cl.
CPC ...... *G06F 11/2094* (2013.01); *G06F 11/1417* (2013.01); *G06F 2201/82* (2013.01)

(58) Field of Classification Search
CPC ............. G06F 11/2094; G06F 11/1417; G06F 11/0793; G06F 11/0727; G06F 11/0754; G06F 2201/82
See application file for complete search history.

(56) References Cited

U.S. PATENT DOCUMENTS

| | | | |
|---|---|---|---|
| 7,861,122 B2 | 12/2010 | Cornwell et al. | |
| 8,949,508 B2 | 2/2015 | Wakrat et al. | |
| 9,478,298 B2 | 10/2016 | Shin et al. | |
| 10,134,477 B2 | 11/2018 | Park et al. | |
| 10,223,216 B1* | 3/2019 | Dubeyko | G11C 29/88 |
| 2006/0010282 A1 | 1/2006 | Kim | |
| 2012/0047409 A1 | 2/2012 | Post et al. | |
| 2013/0073789 A1 | 3/2013 | Khmelnitsky et al. | |
| 2013/0111298 A1 | 5/2013 | Seroff et al. | |
| 2015/0187442 A1 | 7/2015 | Sivasankaran et al. | |
| 2015/0287478 A1 | 10/2015 | Chen et al. | |
| 2016/0034206 A1* | 2/2016 | Ryan | G06F 12/0246 711/103 |
| 2016/0225456 A1* | 8/2016 | Lin | G11C 5/144 |
| 2016/0239235 A1* | 8/2016 | Chung | G11C 16/0483 |
| 2016/0260481 A1 | 9/2016 | Mura et al. | |
| 2017/0177225 A1* | 6/2017 | Mehta | G06F 3/0649 |
| 2018/0060148 A1* | 3/2018 | Rudy | G11C 29/38 |
| 2018/0189149 A1* | 7/2018 | Alavi | G06F 11/0793 |
| 2019/0065331 A1* | 2/2019 | Singidi | G06F 11/1068 |
| 2019/0304562 A1* | 10/2019 | Cai | G06F 3/064 |
| 2019/0304563 A1* | 10/2019 | Her | G11C 16/0483 |
| 2019/0369683 A1* | 12/2019 | Vishnubhatla | G06F 1/3206 |

* cited by examiner

*Primary Examiner* — Joseph D Manoskey
(74) *Attorney, Agent, or Firm* — Kligler & Associates Patent Attorneys Ltd

(57) ABSTRACT

A controller includes an interface and storage circuitry. The interface communicates with one or more memory devices, each of the memory devices includes multiple memory cells organized in memory blocks. The storage circuitry is configured to perform multiple storage operations to the memory cells in the one or more memory devices, and mark memory blocks in which one or more storage operations have failed as bad blocks. The controller is further configured to identify a pattern of multiple bad blocks occurring over a sequence of multiple consecutive storage operations, the pattern is indicative of a system-level malfunction in a memory system including the controller, and in response to identifying the pattern, to perform a corrective action to the memory system.

24 Claims, 2 Drawing Sheets

HANDLING MALFUNCTION IN A MEMORY SYSTEM COMPRISING A NONVOLATILE MEMORY BY MONITORING BAD-BLOCK PATTERNS

TECHNICAL FIELD

Embodiments described herein relate generally to data storage, and particularly to methods and systems for handling a malfunction in a memory system comprising a nonvolatile memory, based on monitoring patterns of bad blocks.

BACKGROUND

Various types of nonvolatile memories comprise multiple memory cells that are organized in memory blocks. Bad blocks are memory blocks in which storage reliability in at least some of the memory cells is not guaranteed. Bad blocks may be identified at production, or develop during the lifetime of the device, and are typically excluded from the pool of usable memory blocks.

Methods for managing bad blocks in nonvolatile memories are known in the art. For example, U.S. Pat. No. 10,134,477 describes a nonvolatile memory device that includes a memory cell array that stores data, and control logic. The control logic is configured to control a read operation, a program operation, or an erase operation on the data. The control logic is configured to detect a first power noise based on one of voltage sources to be provided to the memory cell array and a first reference voltage and detect a second power noise based on the one voltage source of the voltage sources and each of the first reference voltage and a second reference voltage. The control logic is configured to determine whether to perform at least one of an operation period of the read operation, an operation period of the program operation, or an operation period of the erase operation, based on whether at least one of the first and second power noises is detected.

U.S. Patent Application Publication 2015/0287478 describes an apparatus comprising a memory and a controller. The memory is configured to process a plurality of read/write operations. The memory comprises a plurality of memory unit granularities each having a size less than a total size of the memory. The controller is configured to process a plurality of I/O requests to the memory units of the memory that are not marked as bad on a memory unit list. The controller is configured to track a plurality of bad blocks of the memory. The controller is configured to determine which of the memory units to mark as bad based on a test of whether a unit of memory larger than a block of the memory has failed. The test is based on a threshold of the bad blocks in the unit of memory.

SUMMARY

An embodiment that is described herein includes a controller including an interface and storage circuitry. The interface communicates with one or more memory devices, each of the memory devices includes multiple memory cells organized in memory blocks. The storage circuitry is configured to perform multiple storage operations to the memory cells in the one or more memory devices, and mark memory blocks in which one or more storage operations have failed as bad blocks. The controller is further configured to identify a pattern of multiple bad blocks occurring over a sequence of multiple consecutive storage operations, the pattern is indicative of a system-level malfunction in a memory system including the controller, and in response to identifying the pattern, to perform a corrective action to the memory system.

In some embodiments, the storage circuitry is configured to identify the pattern by detecting that a number of memory blocks marked as bad blocks, over the sequence of the storage operations, exceeds a predefined threshold number. In other embodiments, the storage circuitry is configured to identify the pattern by detecting that a number of memory blocks marked as bad blocks within a predefined time interval exceeds a predefined threshold number. In yet other embodiments, the storage circuitry is configured to perform the corrective action by resetting at least one of the memory devices.

In an embodiment, the storage circuitry is configured to perform the corrective action by performing software reboot. In another embodiment, the storage circuitry is configured to check an environmental condition using a sensor, and to perform the software reboot only when the environmental condition meets a predefined criterion. In yet another embodiment, the storage circuitry is configured to perform the corrective action by controlling a power supply to increase a supply voltage provided to the one or more memory devices.

In some embodiments, the storage circuitry is configured to perform the corrective action by refraining from performing storage operations that access multiple different groups of the memory cells in parallel. In other embodiments, the memory devices support caching data to be programmed, and the storage circuitry is configured to perform the corrective action by controlling the memory devices to accept data for direct programming without caching. In yet other embodiments, the storage circuitry is configured to perform the corrective action by controlling the memory devices to reprogram dedicated memory cells serving as drain select transistors and source select transistors in the memory devices.

In an embodiment, the storage circuitry is configured to perform the corrective action by reducing a clock rate at which the interface via which the controller communicates with the one or more memory devices operates. In another embodiment, the storage circuitry is configured to attempt reviving one or more of the bad blocks associated with the pattern, following the corrective action.

There is additionally provided, in accordance with an embodiment that is described herein, a method for data storage, including, in a controller that communicates with one or more memory devices, each of the memory devices including multiple memory cells organized in memory blocks, performing multiple storage operations to the memory cells in the one or more memory devices, and marking memory blocks in which one or more storage operations have failed as bad blocks. A pattern of multiple bad blocks occurring over a sequence of multiple consecutive storage operations is identified, the pattern is indicative of a system-level malfunction in a memory system including the controller. In response to identifying the pattern, a corrective action is performed to the memory system.

These and other embodiments will be more fully understood from the following detailed description of the embodiments thereof, taken together with the drawings in which:

DETAILED DESCRIPTION OF EMBODIMENTS

Overview

Figure 1:
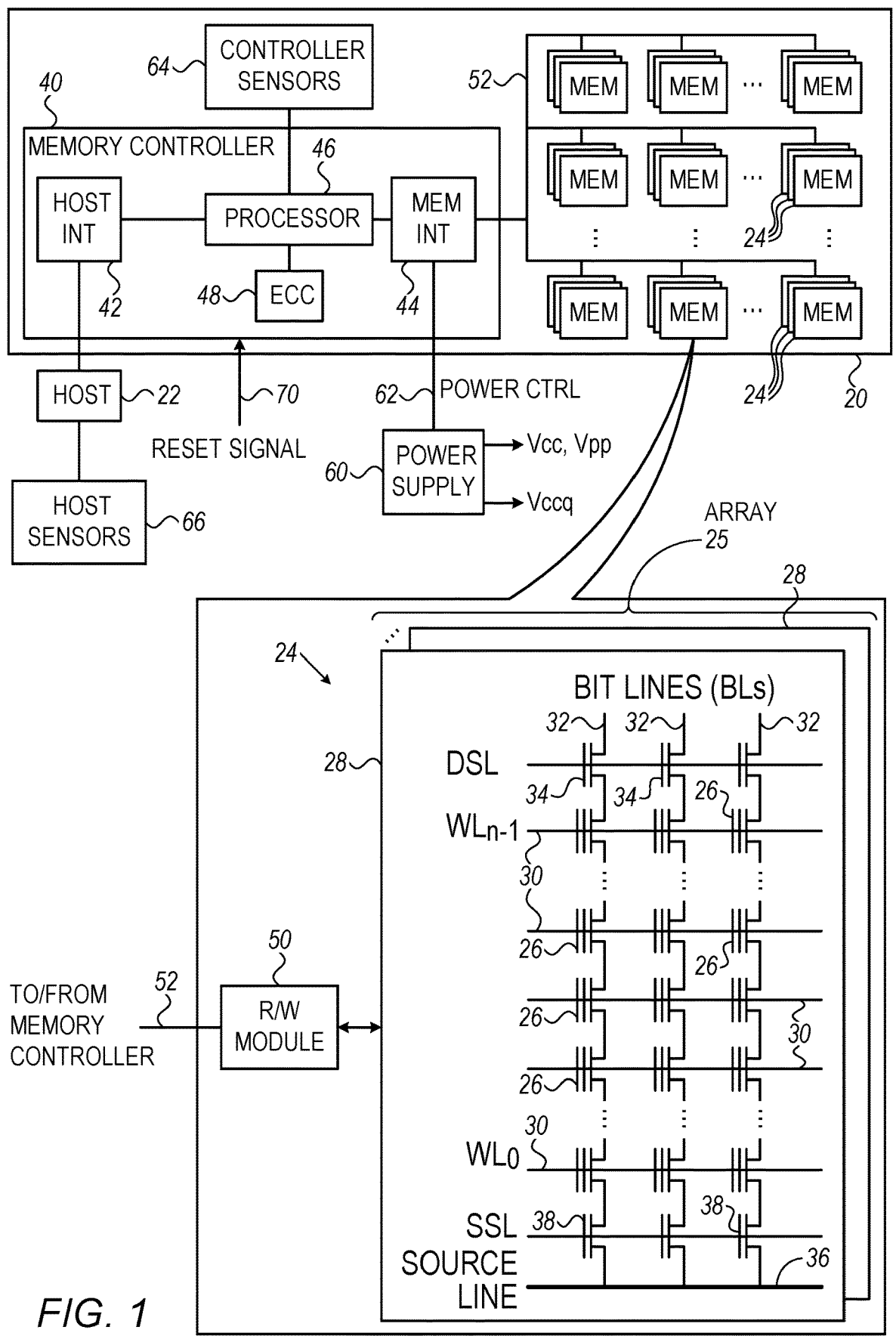
FIG. 1 is a block diagram that schematically illustrates a memory system in which system-level malfunction is detected by monitoring patterns of bad-blocks, in accordance with an embodiment that is described herein.

Various storage systems comprise a controller that stores data in one or more memory devices. The memory devices comprise memory cells that are typically arranged in memory blocks comprising one or more arrays of rows and columns.

Due to manufacturing issues or wearout during the memory lifetime, a small number of the memory blocks may suffer from storage reliability degradation below an acceptable level. Such memory blocks are referred to as "bad blocks" and may be excluded from usage. Bad blocks that are defective due to manufacturing issues (such as process variation) are referred to as original bad blocks (OBBs), whereas bad blocks that fail during the memory lifetime are referred to as growth bad blocks (GBBs). A memory device typically comprises a limited number of spare memory blocks that can replace failing memory blocks.

Embodiments that are described herein provide systems and methods for handling system-level malfunction in a memory system comprising nonvolatile memory, based on monitoring patterns of bad blocks over multiple storage operations. The disclosed embodiments refer mainly to bad blocks of the GBB type.

Over the lifetime of a memory device, an increasing number of memory blocks may become nonfunctional. When running out of spare blocks that replace nonfunctional memory blocks, the storage capacity of the memory device decreases with each identified bad block. In some situations, a persistent system-level problem may result in an accelerated rate of newly-added bad blocks, and eventually the entire memory device may become unusable.

Various reasons may cause an excessive rate of detecting bad blocks. For example, unstable operation of the memory system may occur when operating at low supply voltages for reducing power consumption. Other factors include, for example, jitter in clock signals, degraded performance of electronic circuits and components due to aging, environmental conditions such as extreme temperature and high-level cosmic radiation, and disturb to transistors in the memory array that connect or disconnect columns of the memory cells.

Consider a memory system in which a controller communicates with one or more memory devices in which memory cells are organized in memory blocks. In the context of the present disclosure and in the claims, the term "memory block" refers to a group of memory cells that can be identified as a nonfunctional storage unit, which is also referred to as a "bad block."

In some embodiments, the controller performs multiple storage operations (such as erase, program and read) to the memory cells in the one or more memory devices, and marks memory blocks in which one or more storage operations have failed as bad blocks. The controller identifies a pattern of multiple bad blocks occurring over a sequence of multiple consecutive storage operations, wherein the pattern is indicative of a system-level malfunction within the memory system. In response to identifying the pattern, the controller performs a corrective action to the memory system.

The controller may identify the pattern using any suitable method such as, for example, by detecting that a number of bad blocks detected over the sequence of the storage operations, or within a predefined time interval, exceeds a predefine threshold number.

The controller may apply various corrective actions to resolve the system-level malfunction. For example, in some embodiments, the controller resets at least one of the memory devices. Alternatively or additionally, the controller performs software reboot, possibly after being reset by the host. The controller may first check an environmental condition using a sensor, and performs the software reboot only when the environmental condition meets a predefined criterion. The environmental condition may comprise, for example, temperature, battery charge level, and the like.

In some embodiments, the controller performs the corrective action by controlling a power supply of the memory system to increase at least one of the supply voltages (such as Vcc, Vpp and Vccq) provided to the controller and to the one or more memory devices.

In some embodiments, the memory system is configured to a high level of parallel operation. For example, the controller accesses multiple memory devices and/or multiple planes within a memory device, in parallel, which mode of operation is more sensitive to failures than serial operation. In embodiments of this sort, the controller performs the corrective action by refraining from performing storage operations that access multiple different groups of the memory cells in parallel.

Other possible corrective actions include, for example, disabling caching data for programming in the memory devices, and reprogramming dedicated memory cells in the memory devices that serve as drain select transistors and source select transistors.

A memory block that is detected as a bad block during system malfunction is quite possibly not bad. In other words, a storage operation in the memory block may have failed because of the system malfunction, and not because there is something wrong with the memory block itself. In some embodiments, the controller may attempt reviving one or more of the bad blocks associated with the pattern that caused detection of the system-level malfunction.

In the disclosed techniques, a controller identifies a system-level malfunction only by detecting certain patterns of bad blocks over multiple storage operations, and without any additional hardware. By applying a suitable corrective action, stable operation of the memory system is regained, and at least some of the memory blocks that were detected as bad blocks because of the malfunction can be revived.

System Description

FIG. 1 is a block diagram that schematically illustrates a memory system 20 in which system-level malfunction is detected by monitoring patterns of bad-blocks, in accordance with an embodiment that is described herein. Memory system 20 accepts data for storage from a host 22 and stores it in memory, and retrieves data from memory and provides it to the host. In the present example, memory system 20 comprises a Solid-State Disk (SSD) that stores data for a host computer. In alternative embodiments, however, memory system 20 may be used in any other suitable application and with any other suitable host, such as in computing devices, cellular phones or other communication terminals, removable memory modules, Secure Digital (SD)

cards, Multi-Media Cards (MMC) and embedded MMC (eMMC), digital cameras, music and other media players and/or any other system or device in which data is stored and retrieved.

Memory system 20 comprises multiple memory devices 24, each comprising a memory array 25 of multiple memory cells 26 comprised in multiple memory blocks 28. The memory cells are organized in rows and columns that are referred to herein as word lines (WLs) 30 and bit lines (BLs) 32, respectively. Multiple memory blocks 28 typically share a common group of bit lines. Columns of serially-connected memory cells are coupled to bit lines 32 via drain select transistors 34 driven by a drain select line (DSL), and to a source line 36 via source select transistors 38 driven by a source select line (SSL).

In some embodiments, drain select transistor 34 and source select transistor 38 are implemented using a memory cell that is identical or similar to memory cells 26. In some embodiments these memory cells are programmed to pre-defined levels for correct toggling by connecting or disconnecting columns from the bit lines and source line, during device operation. If the charge levels of these memory cells in a given memory block would unintentionally change during operation, the given memory block will likely fail to perform normal storage operations (erase, program and read) and will therefore be marked as a bad block.

In the present example, memory devices 24 comprise non-volatile NAND Flash devices, although any other suitable memory type, such as NOR and Charge Trap Flash (CTF) Flash cells, phase change RAM (PRAM, also referred to as Phase Change Memory—PCM), Nitride Read Only Memory (NROM), Ferroelectric RAM (FRAM), resistive RAM (RRAM or ReRAM), magnetic RAM (MRAM) and/or Dynamic RAM (DRAM) cells, can also be used.

In some embodiments, the memory cells of memory devices 24 comprise analog memory cell that hold a continuous, analog value of a physical parameter, such as an electrical voltage or charge. Any suitable type of analog memory cells, such as the types listed above, can be used. In the present example, each memory device 24 comprises a non-volatile memory of NAND Flash cells. The charge levels stored in the cells and/or the analog voltages or currents written into and read out of the cells are referred to herein collectively as analog values or storage values.

Memory system 20 stores data in the memory cells by programming the memory cells to assume respective memory states, which are also referred to as programming levels. The programming levels are selected from a finite set of possible levels, and each level corresponds to a certain nominal storage value. For example, a 2 bit/cell Multi-Level Cell (MLC) device can be programmed to assume one of four possible programming levels by writing one of four possible nominal storage values into the cell. Similarly, a Three-Level Cell (TLC) device and a Quad-Level Cell (QLC) device can be programmed to assume one of eight and sixteen possible programming levels, respectively.

Memory device 24 comprises a reading/writing (R/W) module 50, which converts data for storage in the memory device to analog storage values and writes them into memory cells 26. In alternative embodiments, the R/W module does not perform the conversion, but is provided with voltage samples, i.e., with the storage values for storage in the memory cells. When reading data out of memory array 25, R/W module 50 converts the storage values of memory cells 26 into digital samples having an integer resolution of one or more bits. Data is typically written to and read from the memory cells in data units that are referred to as data pages (or simply pages, for brevity).

Memory blocks 28 are also referred to as erasure blocks, i.e., groups of memory cells that are erased together. Data typically cannot be reprogrammed in-place, and memory blocks are therefore erased before being programmed with other data.

In some embodiments, each data page comprises an entire row of the array, i.e., a word line. In alternative embodiments, each row (word line) can be divided into two or more data pages. For example, in some devices each row is divided into two data pages, one comprising the odd-order memory cells and the other comprising the even-order memory cells. In some embodiments, memory pages are sub-divided into sectors.

In some embodiments, a given memory die comprises multiple memory arrays (such as memory array 25) that are referred to as planes, and it is possible to program multiple pages into multiple respective planes in parallel. Typically, failing word lines can cause failure to word lines within the planes of a given die, but not with the planes of other dies.

Each memory device 24 may comprise a packaged device or an unpackaged semiconductor chip or die. A typical SSD may comprise a number of memory devices, each having a capacity of 32 Gbytes, for example. Generally, however, memory system 20 may comprise any suitable number of memory devices of any desired type and size. Although the system configuration of FIG. 1 comprises multiple memory devices, some of the methods and systems described herein can also be used in systems having only a single memory device, e.g., a memory device having two or more planes.

Memory system 20 comprises a memory controller 40, which accepts data from host 22 and stores it in memory devices 24, and retrieves data from the memory devices and provides it to the host. Memory controller 40 comprises a host interface 42 for communicating with host 22, a memory interface 44 for communicating with memory devices 24, and a processor 46 that processes the stored and retrieved data. In some embodiments, memory controller 40 encodes the stored data with an Error Correction Code (ECC). In these embodiments, memory controller 40 comprises an ECC module 48, which encodes the data before stored in memory devices 24 and decodes the ECC of data retrieved from memory devices 24. The functions of processor 46 can be implemented, for example, using software running on the processor, using hardware (e.g., state machine or other logic), or using a combination of software and hardware elements.

Memory controller 40 communicates with memory devices 24 over a bus 52. Bus 52 may comprise any suitable link or bus such as a parallel bus or a serial bus, or a packet-based bus such as PCIe. Bus 52 may operate in accordance with any suitable standard or protocol, and at any suitable rate. In some embodiments, the clock rate at which memory interface 44 and bus 52 operate is configurable by processor 46.

In some embodiments, the memory controller communicates with the memory device storage commands such as erase, program and read command. The memory controller may communicate with the memory device control commands, e.g., for configuring read thresholds. The disclosed techniques can be carried out by memory controller 40, by R/W module 50, or both. Thus, in the present context, memory controller 40 and R/W module 50 are referred to collectively as "storage circuitry" that carries out the disclosed techniques.

To apply a storage command to a given memory device, the memory controller sends the storage command to the memory device over bus 52. The memory commands are typically processed and executed by R/W module 50. Types of storage commands include, for example, page write, page read and block erasure commands. The memory device executes the storage command internally, and sends back to the memory controller data and/or status information as specified by the command. The memory device typically indicates to the memory controller when the memory device is ready to accept subsequent commands. In some embodiments, memory system 20 supports storage commands that are applied to multiple memory devices in parallel. The memory controller additionally communicates various control commands with the memory devices over bus 52, such as a reset command, and read threshold setting commands.

Memory system 20 comprises a power supply 60 that in the present example provides supply voltages denoted Vcc, Vccq and Vpp. In some embodiments, Vcc is used for die operation and Vccq is used for operating input and output (I/O) circuits related to the communication link between the memory controller and memory devices, including memory interface 44 and bus 52. Typical values of Vcc are, for example 3.3V and 2.5V, whereas typical values of Vccq are, for example, 1.8V and 1.2V. The voltage denoted Vpp is an external high voltage (e.g., 12V) optionally provided for improving memory die efficiency. In some embodiments, power supply 60 (or part thereof) is implemented using an electrical battery.

In alternative embodiments, Vcc Vccq and Vpp may be configured to any other suitable voltage values than the voltage values given by example above. Further alternatively, power supply 60 may provide other suitable number of supply voltages having suitable respective voltage values.

In some embodiments, the memory controller controls power supply 60 using a power control bus 62. In an embodiment, the memory controller configures one or more of voltages Vcc, Vccq and Vpp to a desired level. For example, the memory controller configures the supply voltages to the lowest supported values to reduce power consumption. In an embodiment, the memory controller controls the power supply so as to increase one or more of the supply voltages, e.g., when detecting instability in the operation of the memory system.

Memory system 20 comprises one or more controller sensors 64 that are coupled to the memory controller and are accessible by processor 46. In some embodiments, host 22 is coupled to one or more host sensors 66, and reports sensor information captured by the host sensors to the memory controller. The controller sensors and the host sensors are used for monitoring environmental conditions such as temperature, supply voltages of power supply 60, battery charge status, cosmic radiation level and the like. Upon detecting a system-level malfunction, the memory controller may monitor recent sensor information captured by controller sensors 64, host sensors 66 or both, and based on the sensor information selects a suitable corrective action. Various corrective actions that the memory controller may apply will be described in detail below.

Memory controller 40 comprises a hardware reset signal 70, which may be provided, for example, by host 22, e.g., in response to a reset request by the memory controller, or triggered by the host itself. In response to the hardware reset signal, various circuits of the memory controller are initialized, and processor 46 reboots, for example, by restarting executing its program similarly to booting after power on.

In some embodiments, the memory controller resets one or more of memory devices 24 by sending to the relevant memory device(s) a reset command via memory interface 44 and bus 52. Resetting a memory device is effective, for example, when the failing storage operation causing a bad block is a read operation, because the data is already stored and may be recovered successfully after resetting the memory device.

Memory controller 40, and in particular processor 46, may be implemented in hardware. Alternatively, the memory controller may comprise a microprocessor that runs suitable software, or a combination of hardware and software elements. In some embodiments, processor 46 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

The system configuration of FIG. 1 is an example configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory devices 24 and memory controller 40 are implemented as separate Integrated Circuits (ICs). In alternative embodiments, however, the memory devices and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which one or more of the memory devices are disposed. Further alternatively, some or all of the functionality of memory controller 40 can be implemented in software and carried out by a processor or other element of the host system, or by any other type of memory controller. In some embodiments, host 22 and memory controller 40 may be fabricated on the same die, or on separate dies in the same device package.

Methods for Handling System-Level Malfunction Based on Patterns of Bad Blocks

Under normal operating conditions of the memory system, an event of a memory block becoming nonfunctional and marked as a bad block is relatively rare. An occurrence of a memory block identified as a bad block is also referred to herein as a "bad block event." A system-level malfunction, when persistent, may result in an increased rate of bad block events, which may eventually cause a failure to the entire memory system.

Various reasons may cause an excessive number or a burst of bad block events. For example, in some embodiments, the memory controller reduces power consumption by configuring the supply voltages provided to the memory devices by power supply 60, to respective minimal voltages specified, for example, by the device vendor. Under such conditions, fluctuations (e.g., jitter and/or noise) in the supply voltages may result in bad block events, with high probability.

Other reasons causing increased rate of bad block events include, for example, jitter in clock signals, degraded performance of electronic circuits in the memory controller and the memory devices due to aging, environmental conditions such as high-level cosmic radiation and extreme temperature. In some embodiments, the memory controller identifies a system-level malfunction by identifying an unusual pattern of bad blocks over a sequence of multiple storage operations, as will be described in detail below.

Figure 2:
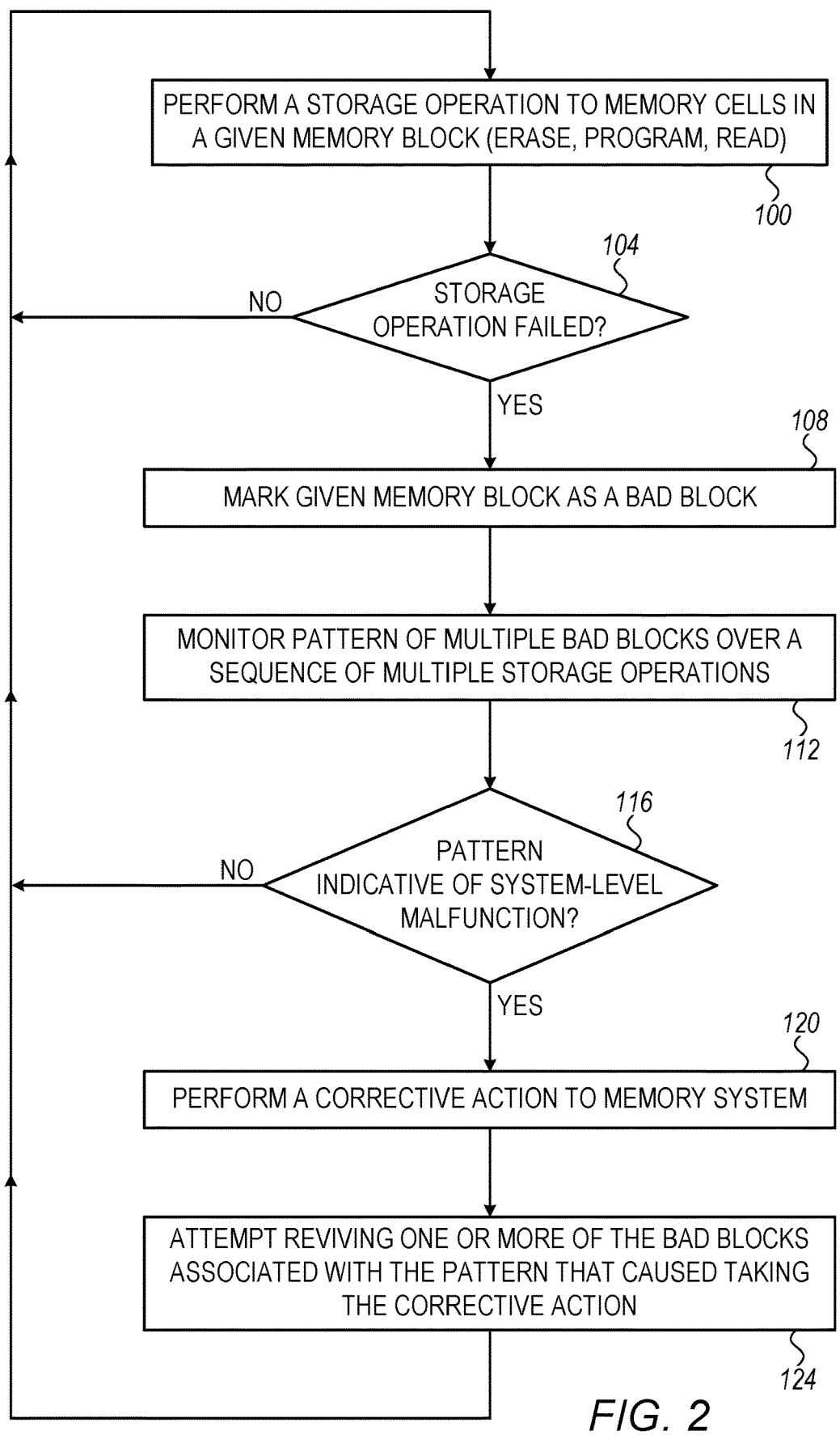
FIG. 2 is a flow chart that schematically illustrates a method for recovery from a system-level malfunction that is detected by identifying certain patterns of bad blocks, in accordance with an embodiment that is described herein.

FIG. 2 is a flow chart that schematically illustrates a method for recovery from a system-level malfunction that is detected by identifying certain patterns of bad blocks, in accordance with an embodiment that is described herein. The method will be described as being executed by processor 46 of memory controller 40 of FIG. 1.

The method begins with processor 46 performing a storage operation to memory cells in a given memory block (or multiple memory blocks, e.g., in parallel) at a storage operation application step 100. The processor applies the storage operation by sending a relevant storage command, via bus 52, to the memory device containing the given memory block. The storage operation may comprise, for example, erasing the given memory block, programming a data page to a word line in the given memory block, or reading a data page from a word line of the given memory block.

In some embodiments, processor 46 receives an indication from the memory device that the storage operation has failed to complete successfully for any reason. For example, in response to a programming failure, the processor receives a program failure indication from the memory device, also referred to herein as a "Program Status Failure" (PSF) indication. Similarly, in response to a failure in erasing a memory block, the processor receives from the memory device an "Erasure Status Failure" (ESF) indication. In some embodiments, the processor detects a failure in a read storage operation by receiving from ECC module 48 an indication that the data retrieved using the read operation contains a number of errors beyond the correction capabilities of the underlying ECC. Such a read failure indication is also referred to as "Unrecoverable Error Correction Code" (UECC) failure.

At a status query step 104, the processor checks whether the storage operation executed at step 100 has failed, based, for example, on receiving a storage failure indication from the memory device containing the given memory block, such as PSF, ESF or UECC. Upon failure, the processor proceeds to a marking step 108, at which the processor marks the failing memory block as a bad block. In an embodiment, the processor selects a valid memory block (when available) from a pool of spare memory blocks, for replacing the failing memory block.

In some embodiments, when the processor detects a bad block in executing a read storage operation, the processor recovers the data in the failing memory block using any suitable recovery scheme such as a Redundant Array of Independent Disks (RAID) scheme. In such embodiments, the processor calculates and stores redundancy information over multiple memory blocks beforehand.

At a pattern monitoring step 112, the processor monitors a pattern of bad blocks that were detected over a sequence of multiple successive storage operations applied by the processor to one or more memory devices. To this end, in an embodiment, the processor stores status information for a predefined number of successive storage operations recently applied. For example, the pattern comprises a fail/pass status for each of the recently performed storage operations. In some embodiments, the pattern also includes occurrence times of bad block events. In an embodiment, the processor uses such timing information for calculating the rate at which bad block events occur or a burst of bad block events.

At a malfunction testing step 116, the processor checks whether the pattern monitored at step 112 is indicative of a system-level malfunction, using any suitable criterion. For example, the processor detects a system-level malfunction by identifying a pattern in which the number of memory blocks marked as bad blocks, over the sequence of the storage operations, exceeds a predefine threshold number. In other embodiments, the processor detects a system-level malfunction by identifying a pattern in which a number of memory blocks marked as bad blocks within a predefined time interval exceeds a predefined threshold number.

Consider, for example, a first pattern [P, F, F, P, P], and a second pattern [F, P, F, F, F], wherein the symbols "P" and "F" denote storage operation pass and fail, respectively. The patterns refer to the five recently applied storage operations. In the first pattern, two out of the five storage operations have failed, whereas in the second pattern, four out of the five storage operations have failed. The second pattern is thus indicative of a system-level malfunction with a higher probability than the first pattern.

When at step 116 the processor detects a system-level malfunction, the processor proceeds to a corrective action step 120. Example corrective actions will be described in detail below.

Since the recent memory blocks marked as bad blocks were detected as nonfunctional under unstable operation of the memory system, these memory blocks may have been falsely detected as bad blocks, and would possibly found functional after performing the corrective action, or in cases in which the system level malfunction is transient and has passed.

At a bad-block reviving step 124, which the processor possibly executes after concluding at least part of the corrective action, the processor attempts reviving one or more of the bad blocks associated with the pattern that at step 116 was found indicative of the system-level malfunction. At step 124, the processor performs one or more storage operations to any of the bad blocks to be revived. A storage operation applied in attempting to revive a bad block may be the same storage operation that caused the memory block failure. Alternatively, a storage operation of a different type or parameters (e.g., different address, or data in case or programming) can be used. When the storage operation at step 124 completes successfully, the processor revives the memory block by reassigning the memory block as a functional memory block, instead of a bad block. Following step 124, and also in the negative branches of steps 104 and 116, the method loops back to step 100 to perform a subsequent storage operation.

Corrective Action Methods for Resolving System-Level Malfunction

As noted above at step 120 of the method of FIG. 2, the processor applies a suitable corrective action to the memory system, in an attempt to resolve the system-level malfunction that caused the excessive rate of bad block events. Several example corrective actions that processor 46 may perform are described in detail below.

In some embodiments, processor 46 applies a corrective action by resetting the memory devices (24) by sending to the memory devices a reset command, over bus 52. Alternatively or additionally, the processor requests host 22 to apply a hardware reset signal (70) to the memory controller. In response to the hardware reset signal, the processor typically executes software reboot. In alternative embodiments, the processor performs the corrective action by executing software reboot without receiving a hardware reset signal. The underlying assumption is that resetting the memory devices and/or the memory controller, may be effective in resolving an unstable operational state of the memory system.

In some embodiments, the processor delays rebooting, triggered by hardware or software, in order to allow the conditions causing the malfunction to be resolved, and/or various elements in the memory system to stabilize. In some embodiments, the processor performs software reboot after a predefined time period has elapsed, or depending on environmental conditions. In an embodiment, while delaying software reboot, the processor configures the memory system to a low power consumption mode. In some embodiments, the processor receives environmental information, e.g., from the controller sensors, and executes software reboot only when the conditions that are suspected to have caused the malfunction are removed. The sensor-based information comprises, for example, levels of supply voltages of power supply 60, temperature level, mechanical stress and the like. In an example embodiment, the processor executes software reboot only when temperature measurements indicate that the environmental temperature has reduced blow a predefined temperature level. As another example, the processor monitors a charge level of a battery that provides supply voltages to elements of the memory system, and executes software reboot only when detecting that the battery is charged above a predefined charging level.

In some embodiments, the host (22) controls delaying the software reboot in the memory controller. In such embodiments, the host tracks environmental conditions using the host sensors, and resets the processor of the memory controller in response to detecting that the environmental conditions are suitable.

In some embodiments, the processor performs the corrective action by increasing one or more of the supply voltages provided by power supply 60. A corrective action of this sort is useful, for example, when the memory system is configured to operate at low voltages for reducing power consumption. In some embodiments, the processor controls the power supply to provide higher Vcc and/or Vpp voltages. Alternatively or additionally, the processor controls the power supply to provide a higher Vccq I/O voltage. Increasing the supply voltages increases the safe margin of noise and jitter in the voltages.

In some embodiments, the system-level malfunction results, at least in part, due to a high level of parallel operation within the memory system. Such parallel operation refers, for example, to the processor accessing multiple memory devices in parallel over bus 52. Alternatively or additionally, parallel operation involves accessing multiple groups of memory cells simultaneously, such as, for example, accessing multiple planes of a given memory device, simultaneously. A high level of parallel operation may cause voltage fluctuations such as noise and sudden voltage drop and peak events and in the supply voltages. This may result in increased failure rate in executing storage operations, and therefore in an increased rate or marking memory blocks as bad blocks. In some embodiments, the processor performs the corrective action by reducing the level of parallel operation in the memory system. For example, the processor accesses the memory devices, and/or planes within memory devices, serially instead of in parallel.

The execution of software reboot by processor 46 typically takes a considerably long time during which the memory system may be unusable, thus degrading the user experience. In some embodiments, the processor performs a corrective action that does not involve (or delays) software rebooting. For example, the processor may first attempt resetting one or more of the memory devices, and only when the malfunction still persists the processor performs software reboot. In an embodiment, the processor receives environmental information from the controller sensors and/or from the host sensors (reported by the host) and refrains from performing (or delays) software reboot based on the environmental information. For example, the processor may reboot after battery becomes sufficiently charged. In some embodiments, the sensors report direct environmental information such as, for example, battery charging level and temperature. In other embodiments, the processor deduces an environmental condition from sensor information captured by the sensors. For example, the processor deduces a condition of excessive cosmic radiation level from location/altitude information provided by a Global Position System (GPS) receiver.

In some embodiments, memory device 24 comprises an internal buffer or cache (not shown). The memory device holds in the cache data to be programmed for a certain time period (also referred to as cache-busy period) during which the buffer is not allowed to be overwritten. When programming the memory devices, the cache-busy periods of the memory devices typically cause communication idle periods during which the memory controller is not allowed to send data to any of the memory devices, and programming idle times during which the memory devices wait for receiving subsequent data from the controller.

The caching mechanism allows the processor to send data for programming a given memory device even when previously sent data has not yet completed the programming operation to the memory cells of that device, thus increasing throughput. Using caching, however, is more sensitive to failures than operating serially, for example, because data rate and over bus 52 increases, disturbing effects such as ground bounce and jitter are more likely to occur, and increased power consumption by the memory controller and memory devices. In some embodiments, coordinating caching between the memory controller and the memory devices fails, causing a large number of bad blocks. Failure may result, for example, because the caching mechanism operates at high rates and increases power consumption, as noted above. In an embodiment, the processor performs the corrective action by sending a control command to the memory devices to accept data for direct programming without caching.

In some embodiments, the system-level malfunction results from operating various elements of the memory system such as the communication link between processor 46 and/or memory devices 24, including memory interface 44 and bus 52, at a high clock rate. Using such high clock rate enables high data rate and throughput, but is more sensitive to failures. In such embodiments, the memory controller performs the corrective action by reducing the clock rate at which the communication link between the memory controller and the memory devices operates.

In some embodiments, memory device 24 comprises drain select transistors (34) and source select transistors (38) that are implemented using a memory cell similar or identical to the memory cells (26) that are used for storage. In some cases, one or more of the drain select transistors and/or source select transistors suffer a disturb that modifies the threshold voltage to which the relevant memory cell (that implements the select transistor) is programmed. Such disturb may cause a failure in a memory block because connecting and disconnecting of columns of memory cells in that memory block fails to function as designed. In some embodiments, the memory device supports a select-transistor initialization command that causes the memory device to erase and reprogram the drain select and source select transistors (implemented as memory cells) in a memory block. In an embodiment, the processor of the memory controller performs the corrective action, by sending the select-transistor initialization command, to one or more of the memory devices.

In some embodiments, a memory device 24 detects an internal voltage violation event, e.g., in the Vcc voltage level, and reports this violation to the processor, for example, upon request. For example, the memory device sends a status word comprising a Vcc violation status bit to the memory controller over bus 52. In response to the voltage violation, the processor performs a suitable corrective action such as, for example, resetting at least the memory device that reported the voltage violation.

The embodiments described are given by way of example and other suitable embodiments can also be used. For example, the system-level malfunction may persist even after performing a corrective action. In such cases, the processor may attempt performing a subsequent corrective action, e.g., of a different type, or preform software reboot, in an embodiment.

In the embodiments described above, the memory controller attempts reviving one or more bad blocks, following applying a corrective action. In some cases, however, e.g., when the system malfunction is temporary or transient, the memory controller may attempt reviving one or more of the recently identified bad blocks without applying any corrective action. In other words, the memory controller may attempt reviving bad blocks associated with the pattern that caused detection of the system-level malfunction.

The embodiments described above are given by way of example, and other suitable embodiments can also be used.

Although the embodiments described herein mainly address bad blocks in NAND Flash devices, the methods and systems described herein can also be used in other applications, such as in suitable storage systems that can identify a group of memory cells as nonfunctional as a storage unit.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A controller, comprising:
    an interface, configured to communicate with one or more memory devices, the memory devices comprising multiple memory cells organized in memory blocks; and
    storage circuitry, configured to:
        perform multiple storage operations to the memory cells in the one or more memory devices, and mark memory blocks in which one or more storage operations have failed as bad blocks;
        identify a pattern of multiple bad blocks occurring over a sequence of multiple consecutive storage operations, wherein the pattern is indicative, according to a predefined criterion, of a system-level malfunction in a memory system comprising the controller, the system-level malfunction causing the storage circuitry to identify in the pattern a given memory block as a bad block even though the given memory block is functional; and
        in response to identifying the pattern, perform a corrective action to the memory system.

2. The controller according to claim 1, wherein the storage circuitry is configured to identify the pattern by detecting that a number of memory blocks marked as bad blocks, over the sequence of the storage operations, exceeds a predefined threshold number.

3. The controller according to claim 1, wherein the storage circuitry is configured to identify the pattern by detecting that a number of memory blocks marked as bad blocks within a predefined time interval exceeds a predefined threshold number.

4. The controller according to claim 1, wherein the storage circuitry is configured to perform the corrective action by resetting at least one of the memory devices.

5. The controller according to claim 1, wherein the storage circuitry is configured to perform the corrective action by performing software reboot.

6. The controller according to claim 5, wherein the storage circuitry is configured to check an environmental condition using a sensor, and to perform the software reboot only when the environmental condition meets a predefined criterion.

7. The controller according to claim 1, wherein the storage circuitry is configured to perform the corrective action by controlling a power supply to increase a supply voltage provided to the one or more memory devices.

8. The controller according to claim 1, wherein the storage circuitry is configured to perform the corrective action by refraining from performing storage operations that access multiple different groups of the memory cells in parallel.

9. The controller according to claim 1, wherein the memory devices support caching data to be programmed, and wherein the storage circuitry is configured to perform the corrective action by controlling the memory devices to accept data for direct programming without caching.

10. The controller according to claim 1, wherein the storage circuitry is configured to perform the corrective action by controlling the memory devices to reprogram dedicated memory cells serving as drain select transistors and source select transistors in the memory devices.

11. The controller according to claim 1, wherein the storage circuitry is configured to perform the corrective action by reducing a clock rate at which the interface via which the controller communicates with the one or more memory devices operates.

12. The controller according to claim 1, wherein the storage circuitry is configured to attempt reviving one or more of the bad blocks associated with the pattern, following the corrective action.

13. A method for data storage, comprising:
    in a controller that communicates with one or more memory devices, the memory devices comprising multiple memory cells organized in memory blocks, performing multiple storage operations to the memory cells in the one or more memory devices, and marking memory blocks in which one or more storage operations have failed as bad blocks;

identifying a pattern of multiple bad blocks occurring over a sequence of multiple consecutive storage operations, wherein the pattern is indicative, according to a predefined criterion, of a system-level malfunction in a memory system comprising the controller, the system-level malfunction causing the controller to identify in the pattern a given memory block as a bad block even though the given memory block is functional; and in response to identifying the pattern, performing a corrective action to the memory system.

14. The method according to claim 13, wherein identifying the pattern comprises detecting that a number of memory blocks marked as bad blocks, over the sequence of the storage operations, exceeds a predefined threshold number.

15. The method according to claim 13, wherein identifying the pattern comprises detecting that a number of memory blocks marked as bad blocks within a predefined time interval exceeds a predefined threshold number.

16. The method according to claim 13, wherein performing the corrective action comprises resetting at least one of the memory devices.

17. The method according to claim 13, wherein performing the corrective action comprises performing software reboot.

18. The method according to claim 17, and comprising checking an environmental condition using a sensor, and wherein performing the software reboot comprises performing the software reboot only when the environmental condition meets a predefined criterion.

19. The method according to claim 13, wherein performing the corrective action comprises controlling a power supply to increase a supply voltage provided to the one or more memory devices.

20. The method according to claim 13, wherein performing the corrective action comprises refraining from performing storage operations that access multiple different groups of the memory cells in parallel.

21. The method according to claim 13, wherein the memory devices support caching data to be programmed, and wherein performing the corrective action comprises controlling the memory devices to accept data for direct programming without caching.

22. The method according to claim 13, wherein performing the corrective action comprises controlling the memory devices to reprogram dedicated memory cells serving as drain select transistors and source select transistors in the memory devices.

23. The method according to claim 13, wherein performing the corrective action comprises reducing a clock rate at which an interface via which the controller communicates with the one or more memory devices operates.

24. The method according to claim 13, and comprising attempting reviving one or more of the bad blocks associated with the pattern, following the corrective action.

* * * * *